(12) United States Patent
Hsieh

(10) Patent No.: US 9,006,850 B2
(45) Date of Patent: Apr. 14, 2015

(54) MOTION SENSING DEVICE

(71) Applicant: Lite-On Semiconductor Corporation, New Taipei (TW)

(72) Inventor: Ming-Hsun Hsieh, Kaohsiung (TW)

(73) Assignee: Dyna Image Corporation, Hsin-Tien Dist., New Taipei (TW)

( * ) Notice: Subject to any disclaimer, the term of this patent is extended or adjusted under 35 U.S.C. 154(b) by 0 days.

(21) Appl. No.: 14/180,294

(22) Filed: Feb. 13, 2014

(65) Prior Publication Data
US 2014/0319636 A1 Oct. 30, 2014

Related U.S. Application Data

(60) Provisional application No. 61/817,306, filed on Apr. 29, 2013.

(30) Foreign Application Priority Data

Nov. 5, 2013 (CN) .......................... 2013 1 0542534

(51) Int. Cl.
*H01L 31/0232* (2014.01)
*G01J 1/42* (2006.01)
(Continued)

(52) U.S. Cl.
CPC . *G01J 1/42* (2013.01); *H01L 25/50* (2013.01); *H01L 25/167* (2013.01); *G01J 2001/4295* (2013.01); *H05K 13/046* (2013.01); *H01L 31/02327* (2013.01); *G06F 3/0354* (2013.01); *G06K 9/60* (2013.01); *G06T 5/008* (2013.01); *G06F 13/24* (2013.01); *H01L 2224/48247* (2013.01); *H01L 27/14618* (2013.01); *H01L 27/14625* (2013.01)

(58) Field of Classification Search
CPC ................... H01L 27/14625; H01L 31/02327; H01L 27/14623; H01L 27/14649; H01L 27/14685; H01L 27/14627; H01L 27/14632
USPC ............. 257/432, 433, 435; 250/338.1, 338.4
See application file for complete search history.

(56) References Cited

U.S. PATENT DOCUMENTS 8,304,850 B2 * 11/2012 Lazarov et al. ............... 257/467
2009/0034081 A1 * 2/2009 Chu et al. ...................... 359/588
(Continued)

FOREIGN PATENT DOCUMENTS

DE          2146 377              3/1973
DE     10 2007 023 893 A1       11/2008

*Primary Examiner* — Minh-Loan Tran
(74) *Attorney, Agent, or Firm* — Winston Hsu; Scott Margo

(57) ABSTRACT

A motion sensing device for sensing infrared rays includes a substrate; an optical module, including a first spacer layer, coupled to the substrate; a first glass layer, formed on the first spacer layer; a second spacer layer, formed on the first glass layer; a second glass layer, formed on the second spacer layer; a third spacer layer, formed on the second glass layer; a first lens, bonding on a first side of the second glass layer; and a second layer, bonding on a second side relative to the first side of the second glass layer; and a coating layer, covered on the optical layer for shielding the infrared rays, wherein the coating layer does not cover the first lens.

6 Claims, 3 Drawing Sheets

(51) Int. Cl.
*H01L 25/00* (2006.01)
*H01L 25/16* (2006.01)
*H05K 13/04* (2006.01)
*G06F 3/0354* (2013.01)
*G06K 9/60* (2006.01)
*G06T 5/00* (2006.01)
*G06F 13/24* (2006.01)
*H01L 27/146* (2006.01)

(56) References Cited

U.S. PATENT DOCUMENTS

2012/0265471 A1 10/2012 Hess
2014/0319348 A1* 10/2014 Hsieh .................... 250/338.1

* cited by examiner

MOTION SENSING DEVICE

CROSS REFERENCE TO RELATED APPLICATIONS

This application claims the benefit of U.S. Provisional Application No. 61/817,306 filed on Apr. 29, 2013 and entitled "3D-Motion Gesture/Proximity Detection Module Sensor (MGPS)", the contents of which are incorporated herein.

BACKGROUND OF THE INVENTION

1. Field of the Invention

The present invention relates to a motion sensing device, and more particularly, to a motion sensing device realized by a wafer level lens.

2. Description of the Prior Art

With the scientific and technological advancement, computer systems are viewed as necessities for ordinary people in their daily lives, from traditional functions, such as word processing and program executing, to modern multimedia processing, and computer games, etc. Thus, technology of the input apparatus also has improved.

A pointing device is utilized for transforming motions of a user into signals via a motion sensor capable of sensing a motion trace for an electronic device having computing capacity, so as to control the movement of graphical cursers or pointers on display screens, to select objects on display screens with a graphical user interface, and to perform control functions displayed on the screen, allowing the user direct interaction with the computer system. Thus, how to realize the motion sensor with high accuracy becomes a topic to be discussed.

SUMMARY OF THE INVENTION

In order to solve the above problem, the present invention provides a motion sensing device realized by a wafer level lens.

The present invention discloses a motion sensing device for sensing infrared rays, comprising a substrate; an optical module, comprising a first spacer layer, coupled to the substrate; a first glass layer, formed on the first spacer layer; a second spacer layer, formed on the first glass layer; a second glass layer, formed on the second spacer layer; a third spacer layer, formed on the second glass layer; a first lens, bonding on a first side of the second glass layer; and a second layer, bonding on a second side relative to the first side of the second glass layer; and a coating layer, covered on the optical layer for shielding the infrared rays, wherein the coating layer does not cover the first lens.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
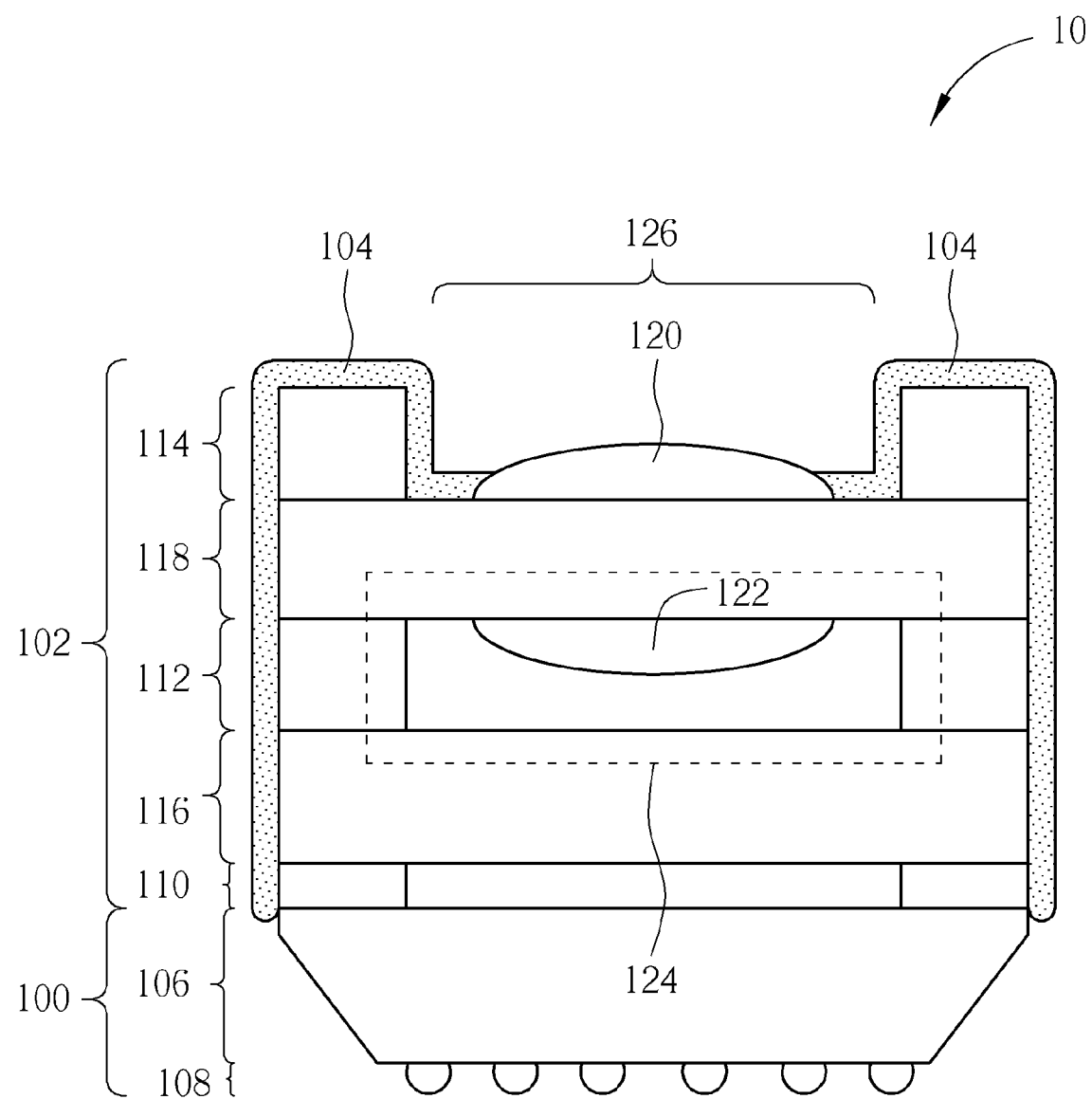
FIG. 1 is a cross section view of a motion sensing device according to an embodiment of the present invention.

Please refer to FIG. 1, which is across section view of a motion sensing device 10 according to an embodiment of the present invention. The motion sensing device 10 is utilized for sensing infrared rays, to detect the moving traces and the motions of external objects. As shown in FIG. 1, the motion sensing device 10 comprises a substrate 100, an optical module 102 and a coating layer 104. The substrate 100 comprises an optical sensing layer 106 and a transmission layer 108, for sensing the light and accordingly outputting corresponded sensing signal. The optical layer 102 comprises spacer layers 110-114, glass layers 116 and 118 and lens 120 and 122, for filtering the light emitting to the substrate 100 such that the light emitting to the substrate 100 only comprises light with a specific wavelength (e.g. the wavelength of the infrared rays). For example, the optical module 102 may be a wafer level lens used for receiving the infrared rays. The coating layer 104 covers the optical layer 102, for preventing additional infrared rays from emitting to the substrate 100. Please note that, the coating layer 104 does not cover the lens 120 (i.e. does not cover the path of light emits to the substrate 100), for ensuring the motion sensing device 10 operates normally. As a result, the motion sensing device 10 for sensing the moving traces and the motions of the external objects can be realized by the wafer level lens. The motion sensing device 10 equipped with micro volume can be achieved.

In detail, the optical sensing layer 106 comprises a sensing unit SEN for sensing the light filter by the optical module 102 and outputting the corresponded sensing signal. According to different applications and design concepts, the method of configuring the sensing unit SEN on the substrate 100 can be appropriately changed. For example, the sensing unit SEN may be configured on the substrate 100 via a chip scale package (CSP) method, printed circuit board method or a lead frame method, and is not limited herein. In this embodiment, the transmission interface layer 108 comprises a ball grid array (BGA) (i.e. realized in the packaging technology of the ball grid array). Via a wafer-level chip scale packaging method with a through-silicon via technique, the sensing signal generated by optical sensing layer 106 can be transmitted to the external circuit through the transmission interface layer 108, for performing corresponded calculating processes.

In addition, the optical module 102 is coupled (e.g. bonded) to the substrate 100 through the spacer layer 110. For example, the spacer layer 110 may be glue or paint, and is not limited herein. The glass layer 116 is configured on the spacer layer 110, for protecting the sensing unit SEN. The spacer 112 is configured between the glass layers 116 and 118, for generating a space 124. In this embodiment, the materials of the spacer layer 112 may comprise glass. The glass layer 118 is configured on the spacer layer 112 as the substrate of the lens 120 and 122. The spacer layer 114 is configured on the glass layer 118 and forms an opening 126. The lens 120 is configured in the opening 126 and is coupled (e.g. bonded) to a side of the glass layer 118 (e.g. the top side of the glass layer 118) via a translucent glue, such as a silicone, an Epoxy, and an Ultraviolet light (UV) Curable Adhesive. Similarly, the lens 122 is configured in the space 124 and is coupled (e.g. bonded) to another side of the glass layer 118 (e.g. the bottom side of the glass layer 118) via the translucent glue.

Finally, since the operations of the sensing unit SEN senses the motions of the objects is achieved via detecting the infrared rays, the sensing unit SEN is sensitive to the variations of infrared rays in the surrounding environment. In such a condition, the coating layer equipped with the function of shielding the infrared rays is needed to cover the optical module 102, for shielding the infrared rays of the specific wavelength range, so as to avoid affecting the sensing result of the sensing unit SEN. Please note that, the coating layer 104 does not cover the lens 120, for ensuring the path of the infrared rays emits to the sensing unit SEN. In addition, the motion sensing device 10 may further comprise an infrared ray emitting unit (not shown in FIG. 1), for emitting the infrared rays capable of passing through the lens 120 and 122 and being sensed by the sensing unit SEN. As a result, via the coating layer 104 absorbing the additional infrared rays, the motion sensing device 10 can receive the infrared rays emitted by the infrared ray emitting unit by the optical module 102 (e.g. the wafer level lens. The functions of sensing the moving traces and motions of the objects can be accordingly achieved, therefore.

Noticeably, the above embodiments provide a motion sensing device realized by the wafer level lens, so as to reduce the manufacture cost and increase the production efficiency via the wafer level manufacturing technology. According to different applications and design concepts, those with ordinary skill in the art may observe appropriate alternations and modifications. For example, the wavelength of the light received by the sensing unit SEN for performing the operations of sensing the moving traces and motions of the objects can be altered to different wavelength ranges, such as the wavelength ranges of the UV and the visible light. Note that, when the wavelength range of the light received by the sensing unit SEN changes, the wavelength range of the light shielded by the coating layer 104 needs to be accordingly altered for avoiding affecting the sensing result of the sensing unit SEN.

In the above embodiments, the single motion device is described for illustrating the structure and the packaging method. In general, when producing the packages of the motion sensing device, the entire packaging materials are configured layer by layer for generating multiple packages at the same time. Then, the multiple packages are sawed for acquiring multiple separate packages. According to different applications, the motion sensing device can be packaged by different packaging methods. For example, the substrate 100 and the optical module 102 can be realized in different wafers. Via wafer bonding, the substrate 100 and the plurality of optical module 102 configured on different wafers can be bonded. Next, the coating layer 104 is formed on each optical module 102 via the package coating. Finally, the single motion sensing device 10 can be acquired after the package sawing process.

On the other hand, the step of bonding the substrate 100 and the plurality of optical modules 102 configured on different wafer can be appropriately modified according to different applications. In an embodiment, the plurality of optical modules 102 configured on the wafer is cut for acquiring the plurality of separate optical modules 102. Each of the optical modules 102 is bonded to the substrate 100 configured on the wafer, and then performing the follow-up processes, such as the coating process and the sawing process. According to the above steps, the single motion sensing device 10 also can be acquired.

Figure 2:
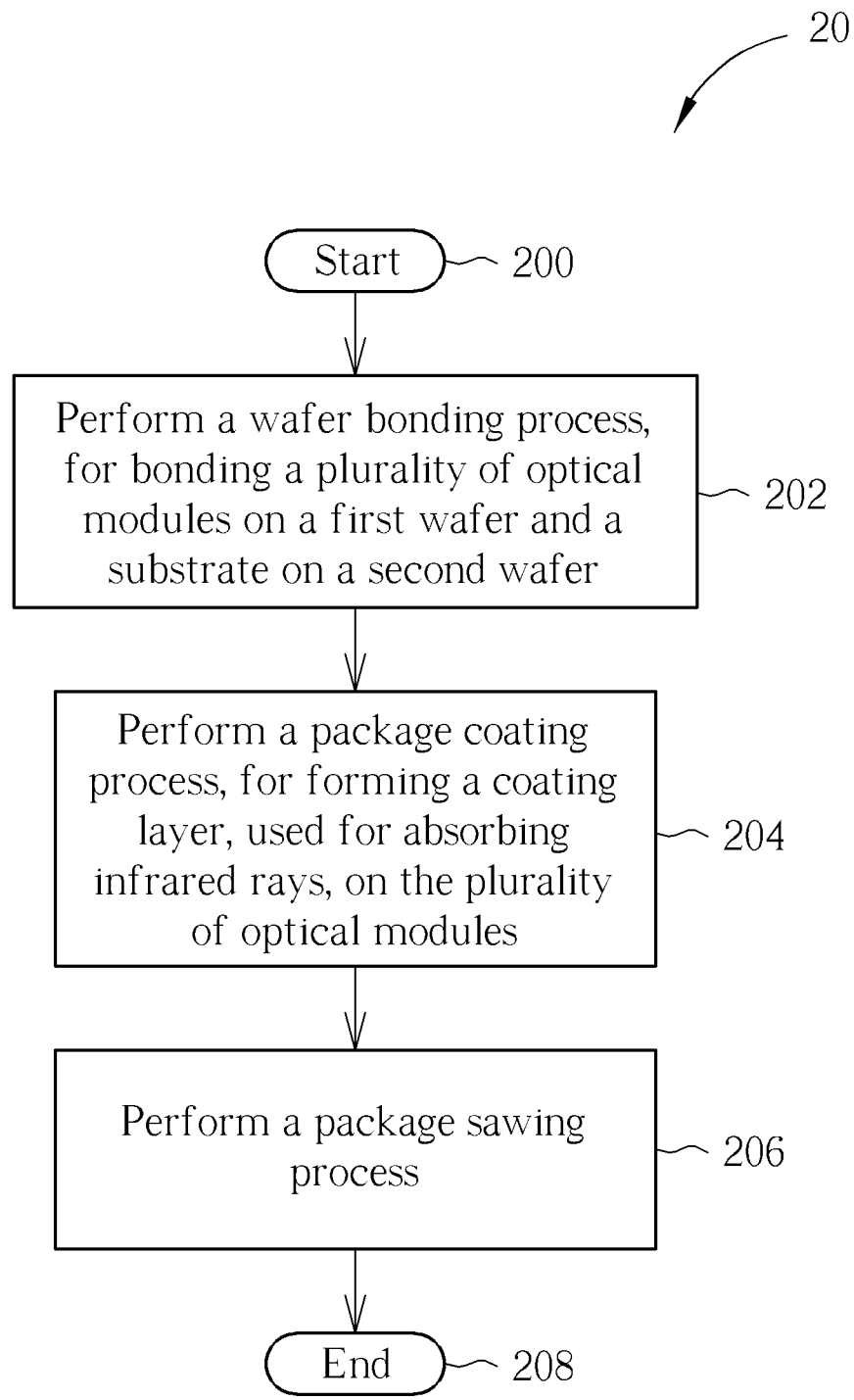
FIG. 2 is a flow chart of a packaging method according to an embodiment of the present invention.

The packaging method of the motion sensing device abovementioned can be summarized into a packaging method 20, as shown in FIG. 2. The packaging method 20 comprises the following steps:

Step 200: Start.
Step 202: Perform a wafer bonding process, for bonding a plurality of optical modules on a first wafer and a substrate on a second wafer.
Step 204: Perform a package coating process, for forming a coating layer, used for absorbing infrared rays, on the plurality of optical modules.
Step 206: Perform a package sawing process.
Step 208: End.

According to the packaging method 20, a plurality of optical modules on a first wafer can be bonded to a substrate on a second wafer. Next, a coating layer can be formed on each optical module for absorbing the infrared rays, via performing a package coating process. After performing a package sawing process, the single motion sensing device can be acquired.

Figure 3:
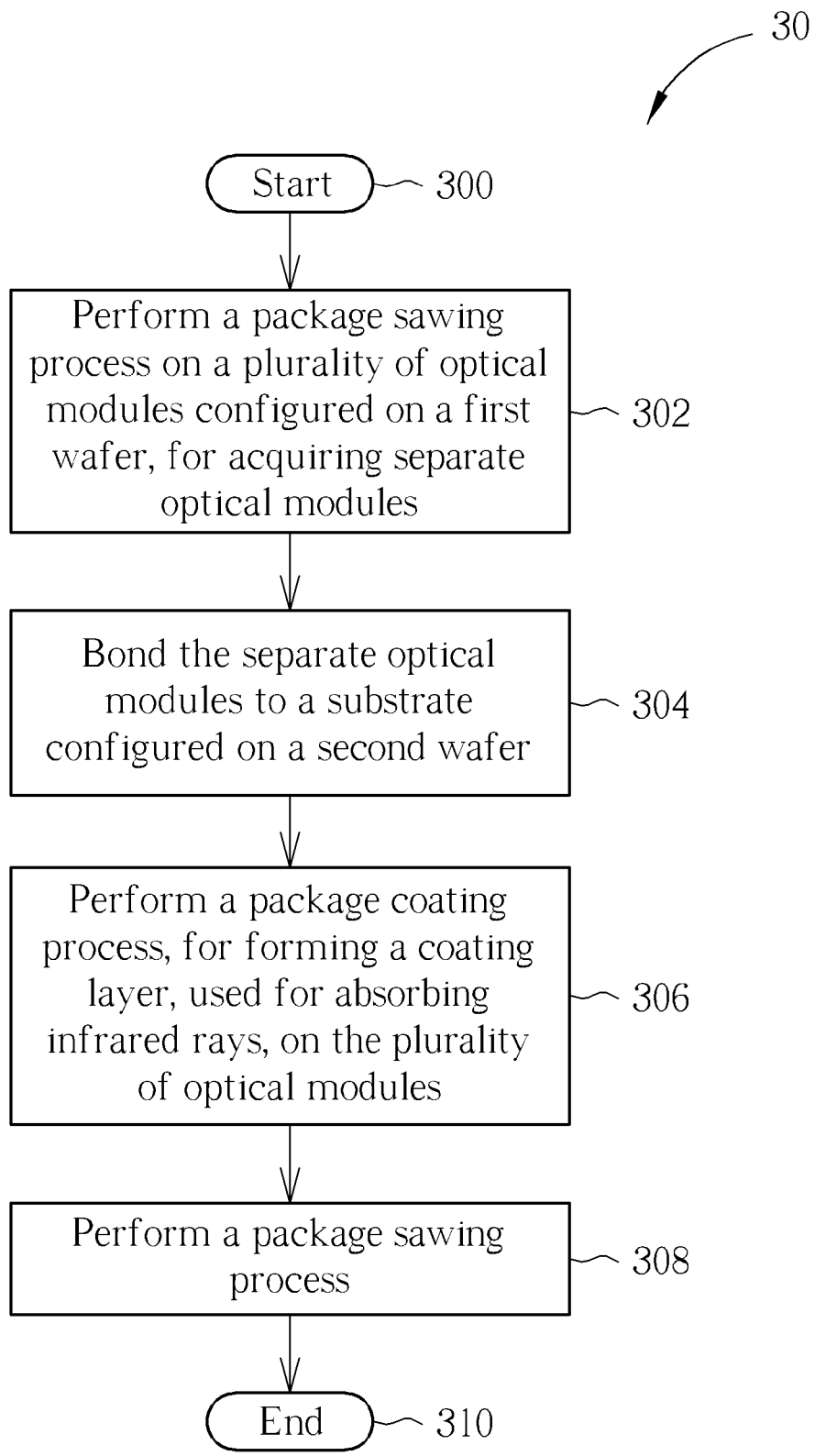
FIG. 3 is a flow chart of another packaging method according to an embodiment of the present invention.

The packaging method of the motion sensing device abovementioned can be further summarized into another packaging method 30, as shown in FIG. 3. The packaging method 30 comprises the following steps:

Step 300: Start.
Step 302: Perform a package sawing process on a plurality of optical modules configured on a first wafer, for acquiring separate optical modules.
Step 304: Bond the separate optical modules to a substrate configured on a second wafer.
Step 306: Perform a package coating process, for forming a coating layer, used for absorbing infrared rays, on the plurality of optical modules.
Step 308: Perform a package sawing process.
Step 310: End.

According to the packaging method 30, the plurality of optical modules configured on the first wafer is sawed into separate optical modules (e.g. wafer level lens) and then the separate optical modules are bonded to the substrate configured on the second wafer. Similar to the steps 204 and 206 of the packaging method 20, after performing the package coating process and the package sawing process, the single motion sensing device is therefore acquired.

To sum up, the above embodiments utilize the wafer level lens to realize motion sensing device. The manufacture cost can be reduced and the production efficiency can be improved via the wafer level manufacturing technology. Moreover, the motion sensing device of the above embodiments can be packaged via different packaging methods according to different applications and design concepts.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A motion sensing device for sensing infrared rays, comprising:
    a substrate;
    an optical module, comprising:
        a first spacer layer, coupled to the substrate;
        a first glass layer, formed on the first spacer layer;
        a second spacer layer, formed on the first glass layer;
        a second glass layer, formed on the second spacer layer;
        a third spacer layer, formed on the second glass layer;
        a first lens, bonding on a first side of the second glass layer; and
        a second lens, bonding on a second side relative to the first side of the second glass layer; and
    a coating layer, covered on the optical layer for shielding the infrared rays, wherein the coating layer does not cover the first lens.

2. The motion sensing device of claim 1, wherein the optical module is a wafer level lens.

3. The motion sensing device of claim 1, wherein the substrate comprises:
   an optical sensing layer, for sensing the infrared layer to output a corresponded sensing signal; and
   a transmission interface layer, for transmitting the sensing signal.

4. The motion sensing device of claim 3, wherein the optical sensing layer comprises a sensing unit and the sensing unit is configured on the substrate via a chip scale package (CSP) method.

5. The motion sensing device of claim 3, wherein the transmission interface layer comprises a ball grid array (BGA).

6. The motion sensing device of claim 3, wherein the optical sensing layer and the transmission layer are coupled via a wafer-level chip scale packaging method with through-silicon via technique.

\* \* \* \* \*